(12) United States Patent
Kwak et al.

(10) Patent No.: US 11,121,170 B2
(45) Date of Patent: Sep. 14, 2021

(54) METHOD FOR MANUFACTURING MICRO ARRAY LIGHT EMITTING DIODE AND LIGHTING DEVICE

(71) Applicant: INDUSTRY-ACADEMIC COOPERATION FOUNDATION OF SUNCHON NATIONAL UNIVERSITY, Suncheon-Si (KR)

(72) Inventors: Joon Seop Kwak, Suncheon-Si (KR); In Yeol Hong, Suncheon-Si (KR); Tae Kyoung Kim, Suncheon-Si (KR)

(73) Assignee: INDUSTRY-ACADEMIC COOPERATION FOUNDATION OF SUNCHON NATIONAL UNIVERSITY

( * ) Notice: Subject to any disclaimer, the term of this patent is extended or adjusted under 35 U.S.C. 154(b) by 0 days.

(21) Appl. No.: 16/483,035

(22) PCT Filed: Jul. 7, 2017

(86) PCT No.: PCT/KR2017/007312
§ 371 (c)(1),
(2) Date: Aug. 1, 2019

(87) PCT Pub. No.: WO2018/143525
PCT Pub. Date: Aug. 9, 2018

(65) Prior Publication Data
US 2020/0235161 A1    Jul. 23, 2020

(30) Foreign Application Priority Data

Feb. 2, 2017 (KR) .................. 10-2017-0014969

(51) Int. Cl.
*H01L 21/04* (2006.01)
*H01L 27/15* (2006.01)
(Continued)

(52) U.S. Cl.
CPC .......... *H01L 27/156* (2013.01); *H01L 21/046* (2013.01); *H01L 21/265* (2013.01); *H01L 33/52* (2013.01); *H01L 2933/005* (2013.01)

(58) Field of Classification Search
CPC ... H01L 27/156; H01L 21/046; H01L 21/265; H01L 33/52; H01L 2933/005;
(Continued)

(56) References Cited

U.S. PATENT DOCUMENTS 10,002,856 B1 * 6/2018 Bedell ................ H01L 21/6836
2008/0063021 A1 * 3/2008 Seo ........................ H01S 5/4031
372/87
(Continued)

FOREIGN PATENT DOCUMENTS

JP     2009088482 A    4/2009
JP     2012502482 A    1/2012
(Continued)

OTHER PUBLICATIONS

Written Opinion for PCT/KR2017/007312 dated Nov. 2, 2017.
International Search Report for PCT/KR2017/007312 dated Nov. 2, 2017.

*Primary Examiner* — Shahed Ahmed
(74) *Attorney, Agent, or Firm* — Renaissance IP Law Group LLP

(57) ABSTRACT

The present invention suggests a method for manufacturing a micro-array light emitting diode comprising: a step for forming a semiconductor lamination structure by stacking an n-type semiconductor layer, an active layer, and a p-type semiconductor layer on a substrate; a step for forming a plurality of p-type electrodes so as to be arranged two-dimensionally apart from each other on the p-type semiconductor layer; and a step for forming an isolation part in the
(Continued)

p-type semiconductor layer exposed between the plurality of p-type electrodes in a self-aligning manner.

12 Claims, 4 Drawing Sheets

(51) Int. Cl.
*H01L 21/265* (2006.01)
*H01L 33/52* (2010.01)

(58) Field of Classification Search
CPC ............ H01L 33/44; H01L 2933/0025; H01L 33/007; H01L 25/167; H01L 2924/12041; H01L 2933/0016; H01L 33/38; H01L 33/62; H01L 33/0008; H01L 33/08; H01L 33/20; H01L 33/0093; H01L 33/00–648; H01L 27/15–156; H01L 2933/00–0091
See application file for complete search history.

(56) References Cited

U.S. PATENT DOCUMENTS

| | | | |
|---|---|---|---|
| 2018/0097033 A1* | 4/2018 | Ahmed | ............... H01L 33/0075 |
| 2018/0190712 A1* | 7/2018 | Xu | ..................... H01L 33/0012 |

FOREIGN PATENT DOCUMENTS

| | | | |
|---|---|---|---|
| JP | 2014060255 A | 4/2014 | |
| JP | 2014093509 A | 5/2014 | |
| JP | 2015501085 A | 1/2015 | |
| KR | 20070047058 A | 5/2007 | |
| KR | 20130029543 A | 3/2013 | |
| KR | 20140006429 A | 1/2014 | |
| KR | 20160080264 A | 7/2016 | |
| KR | 20170007117 A | 1/2017 | |

* cited by examiner

23 : 23a, 23b

METHOD FOR MANUFACTURING MICRO ARRAY LIGHT EMITTING DIODE AND LIGHTING DEVICE

TECHNICAL FIELD

The present disclosure relates to a method for manufacturing a micro-array light emitting diode and a lighting device, and more particularly, to a method for manufacturing a micro-array light emitting diode, in which a dark region between a plurality of light emitting pixels is reduced, and a lighting device.

BACKGROUND ART

A micro-array light emitting diode is constituted by a plurality of light emitting pixels arranged two-dimensionally, and the arranged light emitting pixels may be selectively and individually turned on/off through an electrical control.

An active matrix (AM) micro-array light emitting diode may be a device in which light emitting pixels are individually driven by a transistor (for example, a thin film transistor). The AM micro-array light emitting diode includes a transistor substrate provided with a transistor formed in the form of matrix pattern on a substrate to switch a voltage supplied to each of the light emitting pixels and including a driving circuit (for example, CMOS) supplying an electrical signal to the transistor. Here, the transistor may be a thin film transistor, and the thin film transistor may be made of amorphous silicon or polycrystalline silicon.

Such an AM micro-array light emitting diode, a mask is formed on a semiconductor lamination structure, and then, the semiconductor lamination structure is isolated into a plurality of light emitting pixels through mesa etching so as to individually drive the light emitting pixels. In accordance with the related art, an n-type electrode may be formed between the light emitting pixels to stably supply current, and thus, a distance between the light emitting pixels may increase. Accordingly, a dark region between the plurality of light emitting pixels may be widely generated. Also, in accordance with the related art, the mask may be aligned to isolate the semiconductor lamination structure into the plurality of light emitting pixels. Here, since the mask has to be aligned with accuracy of micrometers, it may be difficult to align the mask. In addition, since the mask is formed with a margin to minimize misalignment, an interval between the plurality of light emitting pixels may be widened. In accordance with the related art, when the semiconductor lamination structure is isolated into the plurality of light emitting pixels, an active layer and a portion of an n-type semiconductor layer as well as a p-type semiconductor layer may be etched to more widen the interval between the plurality of light emitting pixels.

PRIOR ART DOCUMENT

Patent Document

Korean Patent Publication No. 10-2016-0080264

DISCLOSURE OF THE INVENTION

Technical Problem

The present disclosure provides a method for manufacturing a micro-array light emitting diode, in which an internal between a plurality of light emitting pixels is reduced to reduce a dark region between the light emitting pixels, and a lighting device.

Technical Solution

In accordance with an exemplary embodiment, a method for manufacturing a micro-array light emitting diode includes: laminating an n-type semiconductor layer, an active layer, and a p-type semiconductor layer on a substrate to form a semiconductor lamination structure; forming a plurality of p-type electrodes to be spaced apart from each other on the p-type semiconductor layer and arranged two-dimensionally; and forming an isolation part on the p-type semiconductor layer exposed between the plurality of p-type electrodes in a self-aligning manner.

In the formation of the isolation part, the isolation part may be formed by using the plurality of p-type electrodes as a mask.

In the formation of the isolation part, at least a portion of the exposed p-type semiconductor layer may be etched, or at least a portion of the exposed p-type semiconductor layer may increase in electrical insulation.

When at least the portion of the exposed p-type semiconductor layer increases in electrical insulation, at least one of ion implantation, plasma treatment, or E-beam irradiation may be performed.

After the forming of the isolation part, the active layer and the n-type semiconductor layer may be the same as before the formation of the isolation part.

The method may further include: etching portions of the p-type semiconductor layer and the active layer to expose a portion of the n-type semiconductor layer; and forming an n-type electrode on the exposed n-type semiconductor layer as a common electrode of the n-type semiconductor layer.

In the etching of the portions of the p-type semiconductor layer and the active layer, edges of the p-type semiconductor layer and the active layer may be etched, and in the forming of the n-type electrode, the n-type electrode may be formed outside the active layer and the p-type semiconductor layer, of which the edges are etched.

The method may further include: forming an interlayer dielectric on the plurality of p-type electrodes; forming a via hole passing through the interlayer dielectric between the plurality of p-type electrodes to expose the n-type semiconductor layer; and filling a conductive material into the via hole.

The method may further include forming a reflection layer having the same pattern as arrangement of the plurality of p-type electrodes on the p-type semiconductor layer, wherein the forming of the plurality of p-type electrodes and the forming of the reflection layer may performed by using a single mask.

In accordance with another exemplary embodiment, a lighting device includes: the micro-array light emitting diode in accordance with an exemplary embodiment; and a circuit board which includes a plurality of first contact pads electrically connected to the plurality of p-type electrodes and a second contact pad electrically connected to the n-type electrode of the micro-array light emitting diode and on which the micro-array light emitting diode is mounted.

The substrate may be a light-transmitting substrate, and the circuit board may be a thermal conductive substrate.

The lighting device may further include an underfill layer having thermal conductivity and filled between the substrate and the circuit board.

The circuit board may include a transistor unit connected to the p-type electrode to switch current supplied to the p-type electrode.

Advantageous Effects

In the method for manufacturing the micro-array light emitting diode in accordance with the exemplary embodiment, the isolation part may be formed on the p-type semiconductor layer that is exposed between the plurality of p-type electrodes in the self-aligning manner to isolate the semiconductor lamination structure into the plurality of light emitting pixels, thereby reducing the interval between the plurality of light emitting pixels. Thus, the dark region between the plurality of light emitting pixels may be reduced to improve the intensity of light of the micro-array light emitting diode and also improve the visibility of the lighting device.

In addition, in the exemplary embodiment, the n-type electrode may be used as the common electrode of the n-type semiconductor layer to form the n-type electrode on the non-emission area outside the emission area. Thus, the interval between the plurality of light emitting pixels may be more reduced, and the dark region between the plurality of light emitting pixels may be more reduced.

Also, when the semiconductor lamination structure is isolated into the plurality of light emitting pixels, only the p-type semiconductor layer may be etched, or the electrical insulation may be improved to minimize the interval between the plurality of light emitting pixels, thereby minimizing the dark region between the plurality of light emitting pixels. Also, the active layer may be provided on the area between the p-type electrodes to widen the emission area of each of the light emitting pixels and minimize the dark region between the plurality of light emitting pixels.

In the exemplary embodiment, the interval between the plurality of light emitting pixels may be minimized to improve the integration of the plurality of light emitting pixels. Thus, the n-type electrode may be easily used as the common electrode of the plurality of light emitting pixels. Also, the moving distance of the charges through the n-type semiconductor layer may be reduced. Therefore, even though the n-type electrode is formed only outside the emission area, the power may be stably supplied to the plurality of light emitting pixels, and the whole size of the micro-array light emitting diode may be reduced.

MODE FOR CARRYING OUT THE INVENTION

Figure 1:
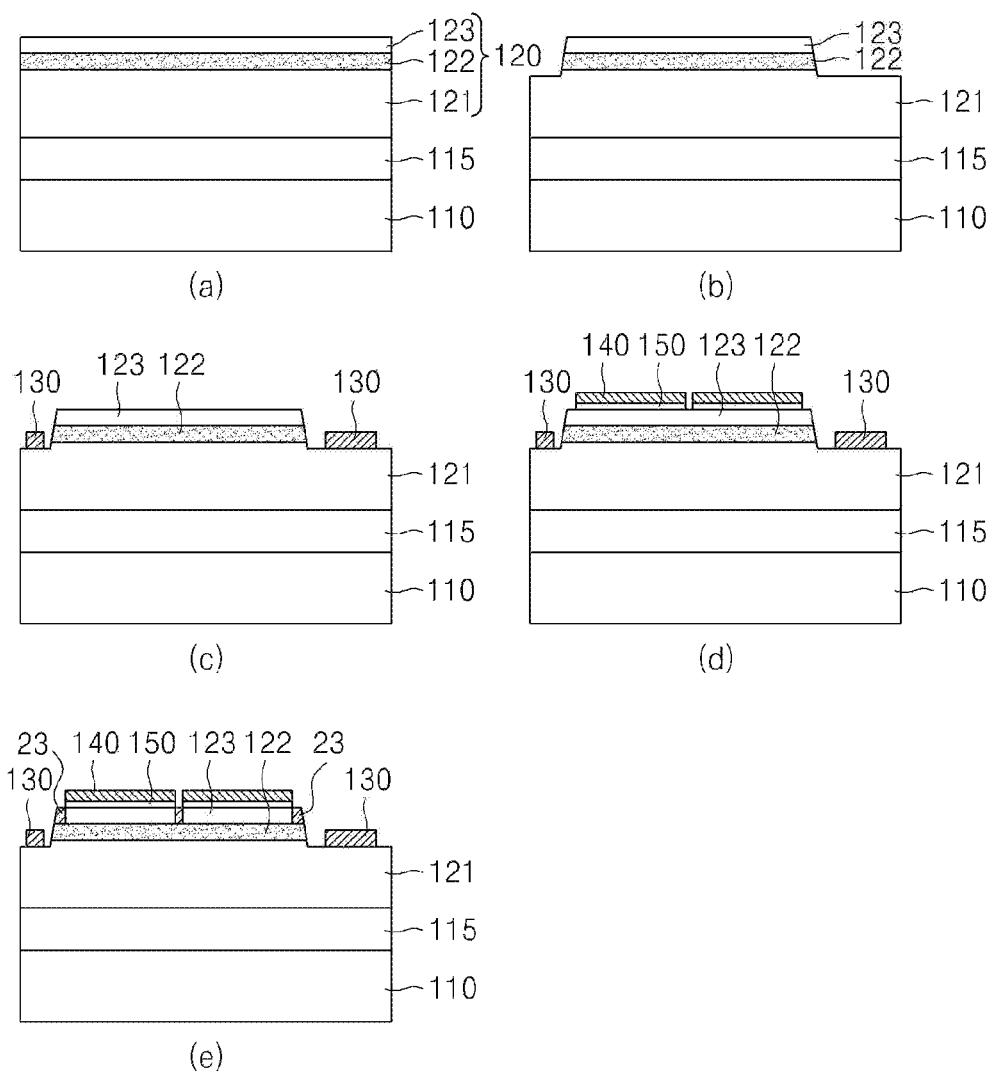
FIG. 1 is a cross-sectional view sequentially illustrating a method for manufacturing a micro-array light emitting diode in accordance with an exemplary embodiment.

Hereinafter, specific embodiments will be described in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. In the descriptions, the same elements are denoted with the same reference numerals. In the figures, the dimensions of layers and regions are exaggerated for clarity of illustration. Like reference numerals refer to like elements throughout.

FIG. 1 is a view sequentially illustrating a method for manufacturing a micro-array light emitting diode in accordance with an exemplary embodiment. (a) of FIG. 1 is a cross-sectional view of a semiconductor lamination structure on a substrate, (b) of FIG. 1 is a cross-sectional view illustrating a state in which portions of a p-type semiconductor layer and an active layer are etched, (c) of FIG. 1 is a cross-sectional view illustrating a state in which an n-type electrode is disposed on an n-type semiconductor layer, (d) of FIG. 1 is a cross-sectional view illustrating a state in which a reflection layer and a p-type electrode are disposed on the p-type semiconductor layer, and (e) of FIG. 1 is a cross-sectional view illustrating a state in which the semiconductor lamination structure is isolated into a plurality of light emitting pixels.

Referring to FIG. 1, a method for manufacturing a micro-array light emitting diode in accordance with an exemplary embodiment may include a process (S100) of laminating an n-type semiconductor layer 121, an active layer 122, and a p-type semiconductor layer 123 on a substrate to form a semiconductor lamination structure 120, a process (S200) of forming a plurality of p-type electrodes 140 that are spaced apart from each other on the p-type semiconductor layer 120 and arranged two-dimensionally, and a process (S300) of forming an isolation part on the p-type semiconductor layer 123 that is exposed between the plurality of p-type electrodes 140 in a self-aligning manner.

First, as illustrated in (a) of FIG. 1, the n-type semiconductor layer 121, the active layer 122, and the p-type semiconductor layer 123 are laminated on the substrate 110 to form the semiconductor lamination structure 120 (S100). Here, the n-type semiconductor layer 121, the active layer 122, and the p-type semiconductor layer 123 may be sequentially laminated on one surface of the substrate 110 to form the semiconductor lamination structure 120.

The substrate 110 may be a substrate that is suitable for growing a semiconductor single crystal and be formed of a transparent material including sapphire. In addition, the substrate 110 may be formed of zinc oxide (ZnO), gallium nitride (GaN), silicon carbide (SiC), aluminum nitride (AlN), silicon (Si), silicon oxide or the like in addition to sapphire. To improve lattice matching between the substrate formed of the material such as sapphire and the semiconductor layer, a buffer layer or a gallium nitride-based support layer (for example, u-GaN), which is generally provided as an AlN/GaN layer or GaN layer, may be formed on the substrate 110. However, in an exemplary embodiment, detailed descriptions of the buffer layer 115 or the gallium nitride-based support layer will be omitted. Also, when the semiconductor lamination structure 120 is provided as organic semiconductor layers, an amorphous silicon (a-Si) substrate, a polycrystalline silicon (poly Si) substrate, an oxide substrate, and the like in addition to the silicon (Si) substrate may be used for the semiconductor lamination structure 120.

The semiconductor lamination structure 120 may include the n-type semiconductor layer 121, the active layer 122, and the p-type semiconductor layer 123, which are laminated on one surface of the substrate 110, and the n-type semiconductor layer 121, the active layer 122, and the p-type semiconductor layer 123 may be sequentially laminated. Hereinafter, the gallium nitride (GaN)-based semiconductor will be mainly described as an exemplary embodiment, but the exemplary embodiment is not particularly limited to the above-described material.

The n-type semiconductor layer 121 may be formed on the substrate 110 and formed of a gallium nitride-based semiconductor material. In more detail, the n-type semiconductor layer 121 may be provided as a GaN layer or GaN/AlGaN layer, which is doped with n-type conductive impurities. Si, Ge, Sn, and the like may be used as the n-type conductive impurities. Here, Si may be mainly used.

The active layer 122 may be formed on the on-type semiconductor layer 121 and provided as an InGaN/GaN layer having a multi-quantum well structure. Also, the active layer 122 may emit light when a voltage is applied to the n-type semiconductor layer 121 and the p-type semiconductor layer 123, or current is supplied to the n-type semiconductor layer 121 and the p-type semiconductor layer 123.

The p-type semiconductor layer 123 may be formed on the active layer 122 and formed of a gallium nitride-based semiconductor material. In more detail, the p-type semiconductor layer 123 may be provided as a GaN layer or GaN/AlGaN layer, which is doped with p-type conductive impurities. Mg, Zn, Be, and the like may be used as the p-type conductive impurities. Here, Mg may be mainly used.

Portions of the p-type semiconductor layer 123 and the active layer 122 may be removed through mesa etching. As a result, a portion of the n-type semiconductor layer 121 may be exposed to a bottom surface.

The method for manufacturing the micro-array light emitting diode in accordance with an exemplary embodiment may further include a process (S150) of etching portions of the p-type semiconductor layer 123 and the active layer 122 to expose a portion of the n-type semiconductor layer 121 and a process (S160) of forming the n-type electrode 130 on the exposed n-type semiconductor layer 121 as a common electrode of the plurality of light emitting pixels 20.

Next, as illustrated in (b) of FIG. 1, the portions of the p-type semiconductor layer 123 and the active layer 122 may be etched to expose the portion of the n-type semiconductor layer 121 (S150). The portions of the p-type semiconductor layer 123 and the active layer 122 may be etched to expose the portion of the n-type semiconductor layer 121, thereby forming the n-type electrode 130 on the n-type semiconductor layer 121.

For example, photoresist PR may be applied on the p-type semiconductor layer 123, and then the photoresist PR on a portion to be etched to expose the n-type semiconductor layer 121 may be exposed and developed by using a photomask, and the portions of the p-type semiconductor layer 123 and the active layer 122 may be etched through an etching process to expose the portion of the n-type semiconductor layer 121.

Here, the photoresist PR may be a photosensitive resin that is chemically changed when light is irradiated. The photoresist PR may be a polymer compound having photosensitivity, adhesiveness, and corrosion resistance and may be used in a photolithography process. Also, in the photolithography process, the photoresist PR may be applied on a surface of a sample to be processed and then dried. Then, the photomask on which a desired pattern is drawn may be closely attached to expose the photoresist PR to a desired pattern by irradiating ultraviolet rays or projecting a photomask shape through an optical system using ultraviolet rays.

Here, the exposed portion of the photoresist PR may be dissolved in the developing process, and the photoresist PR remaining after the development may be cured and dried. As described above, a desired region of the sample may be etched using a wet etching method or a dry etching method by using a film of the simulated photoresist RP as a mask. When the etching is completed, finally remaining photoresist PR may be removed to form a desired pattern. Here, the developing process is performed to remove a predetermined portion of the photoresist PR to form a pattern by separating necessary and unnecessary portions by using a developing solution. The wet etching method using sodium hydroxide (NaOH) and potassium hydroxide (KOH) and the dry etching method using RIE, ECR, and ICP may be used as the method for etching the p-type semiconductor layer 123 that is a nitride-based semiconductor layer and the active layer 122. The portions of the p-type semiconductor layer 123 and the active layer 122 may be etched to expose the portion of the n-type semiconductor layer 121, and then, the photoresist PR remaining on the p-type semiconductor layer 123 may be removed.

Also, as illustrated in (c) of FIG. 1, the n-type electrode 130 as the common electrode of the n-type semiconductor layer 121 may be formed on the exposed n-type semiconductor layer 121 (S160). The n-type electrode 130 may be formed on the n-type semiconductor layer 121 that is exposed by the etching of the active layer 122 and the p-type semiconductor layer 123 and be electrically connected to the n-type semiconductor layer 121. Here, the n-type electrode 130 may be formed as the common electrode of the n-type semiconductor layer 121. All of the n-type semiconductor layers 121 may be electrically connected to each other. Here, when the semiconductor lamination structure 120 is isolated into the plurality of light emitting pixels 20, the n-type electrode 130 may be a common electrode of the plurality of light emitting pixels 20. When the n-type electrode 130 is formed on the n-type semiconductor layer 121 as the common electrode of the plurality of light emitting pixels, the entire area of the n-type electrode 130 may be reduced, and the n-type electrode 130 may be formed on only an edge (or the outside) of the n-type semiconductor layer 121.

For example, the photoresist PR may be applied again on the entire surface of the semiconductor lamination structure 120 over the upper portion of the semiconductor lamination structure 120 through the process of forming the n-type electrode 130, and then, a portion of the photoresist PR, on which the n-type electrode 130 will be formed, on the exposed n-type semiconductor layer 121 may be exposed and developed. Then, a metal material (for example, an n-type metal) may be deposited to form the n-type electrode 130. After the n-type electrode 130 is formed, the photoresist PR remaining on the semiconductor lamination structure 120 may be removed. The n-type electrode 130 may be formed on the n-type semiconductor layer 121 by a known evaporation method such as a chemical vapor deposition method or an electron beam evaporation method, or a process such as sputtering.

In the process (S150) of etching the portions of the p-type semiconductor layer 123 and the active layer 122, edges of the p-type semiconductor layer 123 and the active layer 122 may be etched. In the process (S160) of forming the n-type electrode 130, the n-type electrode may be formed outside of the active layer 122 and the p-type semiconductor layer 123, of which the edges are etched. The edges of the p-type semiconductor layer 123 and the active layer 122, which are the non-emission area, but not a central portion that is the emission area, may be etched to prevent a surface area of the emission area from being reduced by the etching. Also, the n-type electrode 130 may be formed on the n-type semiconductor layer 121, which is exposed by the etching. The n-type electrode 130 may be formed outside (i.e., the non-emission area) the active layer 122 and the p-type semiconductor layer 123, of which the edges are etched. Also, since the n-type electrode 130 is formed as the common electrode of the plurality of light emitting pixels 20, the n-type electrode 130 may be formed on only the non-emission area of the edge of the n-type semiconductor layer 121. In this case, the n-type electrode 130 may not be formed every between the plurality of light emitting pixels 20 but be formed on only the edge (or the non-emission area) of the n-type semiconductor 121 to reduce the interval between the plurality of light emitting pixels 20, thereby reducing the dark region between the plurality of light emitting pixels 20. Thus, in the process (S160) of forming the n-type electrode 130, the n-type electrode 130 may be formed outside the active layer 122 and the p-type semiconductor layer 123, of which the edges are etched.

Also, in the process (S160) of forming the n-type electrode 130, the n-type electrode 130 may be formed along a circumference (i.e., a circumference of the emission area) of the micro-array formed by the plurality of light emitting pixels 20. In this case, when power is applied to the n-type electrode 130, a difference in current (or an amount of supplied current) between the plurality of light emitting pixels 20 depending a distance from the n-type electrode 130 may be reduced. Also, in an exemplary embodiment, the interval between the plurality of light emitting pixels 20 may be reduced so that the plurality of light emitting pixels 20 are gathered into a smaller area (i.e., a surface area of the micro-array is reduced). Thus, an overall moving distance of charges that move to the plurality of light emitting pixels 20 may be reduced in the n-type electrode 130. Thus, the n-type electrode 130 may be formed as the common electrode. Also, the n-type electrode 130 may be formed only outside (or the circumference of the micro-array) the active layer 122 and the p-type semiconductor layer 123, of which the edges are etched.

The reason in which the n-type electrode 130 other than the p-type electrode is formed as the common electrode is because a large amount of n-type impurities is capable of being doped in the n-type semiconductor layer 121 so that the n-type semiconductor layer 121 has relatively higher electric conductivity than that of the p-type semiconductor layer 123, and the current is capable of flowing rapidly. Also, since the n-type semiconductor layer 121 has excellent electric conductivity, and the current flows quickly, even if the n-type electrode 130 is formed on only the circumference (or the emission area) of the micro-array, there is almost no difference in current between the light emitting pixel 20 at the center portion of the micro-array and the light emitting pixel 20 at the edge of the micro-array. Thus, the n-type electrode 130 may be formed on only the edge of the n-type semiconductor layer 121 to reduce the dark region between the plurality of light emitting pixels 20.

Then, as illustrated in (d) of FIG. 1, the plurality of p-type electrodes 140 are formed to be spaced apart from each other on the p-type semiconductor layer 123 so as to be arranged two-dimensionally (S200). The p-type electrodes 140 may be formed on the p-type semiconductor layer 123 to supply current to the p-type semiconductor layer 123. Here, the p-type electrodes may be spaced apart from each other to be arranged two-dimensionally, thereby supplying the current to each of the plurality of light emitting pixels 20.

For example, to form the p-type electrode 140, the photoresist PR may be applied again on the p-type semiconductor layer 123, and then, a portion of the photoresist PR, on which the p-type electrode 140 will be formed, may be exposed and developed to be removed. Thereafter, a metal material (for example, a p-type metal) may be deposited on the p-type semiconductor layer 123 to form the p-type electrode in a lift-off manner or by removing the remaining photoresist PR. The p-type electrode 140 may be deposited on the p-type semiconductor layer 123 by the known evaporation method such as the chemical vapor deposition method or the electron beam evaporation method, or the process such as sputtering. Here, the lift-off manner represents a method in which the photoresist PR is applied, and a spot-shaped ultraviolet ray is irradiated to a deposition area to develop and remove the photoresist PR, and then, a deposition layer (or a light-blocking layer) such as chromium is deposited to remove the deposition layer (for example, chromium) of a non-deposition area together with the photoresist PR.

Also, the p-type electrode 140 may be formed on the p-type semiconductor layer 123 and formed of one metal or two or more alloys selected from Ag, Al, Au, Cr, Cu, Ir, Mg, Nd, Ni, Pd, Pt, Rh, Ti, W, and the like. Here, the p-type electrode 140 may be formed of a reflection electrode using a metal having high reflectivity. Here, the reflection electrode may reflect light, which is not emitted toward the substrate 110 but emitted toward an opposite side of the substrate 110 among light emitted from the active layer 122, toward the substrate 110. Also, the p-type electrode 140 may be formed of two or more alloys of metals having high reflectivity, may be formed with a lamination structure of different metals, or may be formed with a lamination structure of an ITO, IZO, ZnO, or In2O3 film and a metal having high reflectivity. Also, an adhesion layer (not shown) for improving adhesion with the p-type semiconductor layer 123 or an ohmic contact layer (not shown) for implementing ohmic contact may be further laminated between the p-type electrode 140 and the p-type semiconductor layer 123. The p-type electrode 140 may have the same surface area (horizontal surface area) as the light emitting pixel 20. In this case, when the semiconductor lamination structure 120 is isolated into the plurality of light emitting pixels 20, the p-type electrode 140 may be used as a self-mask, and when the p-type electrode 140 is the reflection electrode, a reflection surface may increase to maximally increase in amount of light reflected by the reflection surface.

The method for manufacturing the micro-array light emitting diode in accordance with an exemplary embodiment may further include a process (S190) of forming a reflection layer 150 having the same pattern as that of the arrangement of the plurality of p-type electrodes 140 on the p-type semiconductor layer 123. The process (S200) of forming the plurality of p-type electrode 140 and the process (S190) of forming the reflection layer 150 may be performed by using a single mask.

As illustrated in (d) of FIG. 1, the reflection layer 150 having the same pattern as that of the arrangement of the plurality of p-type electrodes 140 may be formed on the p-type semiconductor layer 123 (S190). The reflection layer 150 may be formed between the p-type semiconductor layer 123 and the p-type electrode 140 in the form of the same pattern as that of the arrangement of the plurality of p-type electrodes 140, and the reflection layer 150 and the p-type electrode 140 may be formed to be laminated. Here, the process (S190) of forming the reflection layer 150 may be performed before the process (S200) of forming the plurality of p-type electrodes 140, or the process (S190) of forming the reflection layer 150 and the process (S200) of forming the plurality of p-type electrodes 140 may be performed at the same time. The micro-array light emitting diode 100 in accordance with an exemplary embodiment may be a bottom-emission type light emitting diode such as a flip-chip type light emitting diode. The bottom-emission type light emitting diode is a light emitting diode that emits light to the substrate 110 instead of emitting light through a top surface of the semiconductor lamination structure 120. In an exemplary embodiment, light that is not emitted toward the substrate 110 but emitted toward an opposite side of the substrate 110 among light emitted from the active layer 122 may be reflected by the reflection layer 150 formed on the p-type semiconductor layer 123 and thus be effectively emitted through the substrate 110. The flip-chip type of the bottom-emission type may be a light emitting diode that emits light from the substrate by turning the chip upside down. The limitation of the top-emission type in accordance with the related art, in which light is reflected by the p-type electrode disposed on the top surface of the semiconductor lamination structure 120 and thus is not emitted, may be solved.

The reflection layer 150 may be a distributed bragg reflecting (DBR) layer formed by alternately laminating a metal reflection layer defining a mirror surface or oxide layers having different refractive indexes (for example, SiO2 and TiO2). To more improve light emitting efficiency, the reflection layer 150 may be disposed between the p-type semiconductor layer 123 and the p-type electrode 140 to reflect the light, which emitted in the opposite direction of the substrate 110, toward the substrate 110. Thus, the light emitting efficiency may be more improved when compared to the top-emission type in accordance with the related art. When the p-type electrode is formed as the reflection layer to reflect the light, which is emitted in the opposite direction of the substrate 110, toward the substrate 110, the reflection layer 150 may be omitted.

Also, the process (S200) of forming the plurality of p-type electrode 140 and the process (S190) of forming the reflection layer 150 may be performed by using a single mask. The plurality of p-type electrodes 140 and the reflection layer 150 may be formed with the same size and pattern as each other so that the p-type electrode 140 is used as the mask. The plurality of p-type electrodes 140 and the reflection layer 150 may be sequentially laminated by using the single mask to form the plurality of p-type electrodes 140 and the reflection layer 150, which have the same size and pattern. Here, the single mask may include a metal mask for depositing the plurality of p-type electrodes 140 and the reflection layer 150 in accordance with the formed pattern and a photomask used in the photolithography process. Here, in the case of the metal mask, since the deposition area varies in accordance with a distance from the metal mask, it may be preferable to form the plurality of p-type electrodes 140 and the reflection layer 150 by using the photoresist (PR) film as a mask through the photolithography process using the photomask. In the case in which the photoresist (PR) film is used as the mask, the sizes (or surface areas) of the plurality of p-type electrodes 140 and the reflection layer 150 may be maximally the same.

When the plurality of p-type electrodes 140 and the reflection layer 150 are formed by using the single mask, the plurality of p-type electrodes 140 and the reflection layer 150 may be formed with one alignment through the single mask. Thus, the alignment may be easy, and the process of forming the plurality of p-type electrodes 140 and the reflection layer 150 may be simplified. Also, the plurality of p-type electrodes 140 and the reflection layer 150 are formed by aligning the single mask only once so that the sizes and the patterns of the plurality of p-type electrodes 140 and the reflection layer 150 are maximally the same.

Thereafter, as illustrated in (e) of FIG. 1, the isolation part 23 is formed on the p-type semiconductor layers 123 exposed between the plurality of p-type electrodes 140 in the self-aligning manner (S300). Here, the isolation part 23 may be an area on which the semiconductor lamination structure 120 is isolated into the plurality of light emitting pixels 20. The isolation part 23 may include an etched part 23a in which the exposed p-type semiconductor layer 123 is etched and an insulation part 23b in which the exposed p-type semiconductor layer 123 increases in insulation. In the process (S300) of forming the isolation part 23, the isolation part 23 may be formed on the exposed p-type semiconductor layer 123 in the self-aligning manner to isolate the semiconductor lamination structure 120 into the plurality of light emitting pixels 20. Here, the self-aligning for the isolation may be performed by the constituents (for example, the plurality of p-type electrodes or the reflection layer) such as the plurality of p-type electrode 140 formed on the p-type semiconductor layer 123. Also, the plurality of p-type electrodes 140 or the reflection layer 150 may be formed along the pattern for the isolation, and at least a portion of the exposed p-type semiconductor layer 123 may be changed into the isolation part 25 to isolate the semiconductor lamination structure 120 into the plurality of light emitting pixels 20. Here, the laminated structure of the plurality of p-type electrodes 140 and the reflection layer 150 or the laminated structure of the p-type electrode 140 and the reflection layer 150 may be used as the mask. When the reflection layer 150 is used as the mask, each of the plurality of p-type electrodes 140 may have a size (surface area) less than that of the reflection layer 150, and thus, the p-type semiconductor layer 123 may be exposed between the reflection layers 150 (or the patterns).

Since the isolation part 23 is formed on the exposed p-type semiconductor layer 123 in the self-aligning manner, when the semiconductor lamination structure 120 is isolated into the plurality of light emitting pixels 20, an additional alignment of the mask for the isolation may not be required to prevent misalignment from occurring. Thus, the isolation part 23 may be formed by using the plurality of p-type electrodes 140 as the mask without the margin after forming the plurality of p-type electrodes 140 to reduce the interval between the plurality of light emitting pixels 20, thereby reducing the dark region between the plurality of light emitting pixels 20 generated by the isolation part 23.

That is to say, since the semiconductor lamination structure 120 is isolated into the plurality of light emitting pixels 20 through the mesa etching for etching even the portions of the active layer 122 and the n-type semiconductor layer 121 after the additional mask for the isolation is formed on the semiconductor lamination structure, a slope may be generated on both sides of the etched region to deeply etch the surface of the n-type semiconductor layer 121 to a depth of approximately 150 nm or more, and the interval between the plurality of light emitting pixels 20 may increase. In addition, since the mask for the mesa etching forms the pattern with the margin to prevent misalignment from occurring, the interval between the plurality of light emitting pixels 20 may be widened to about 30 µm or more. However, in an exemplary embodiment, since it is not deeply etched like the mesa etching, an additional mask for the mesa etching may not be required. Thus, the isolation part 23 may be formed in the self-aligning manner in which the additional alignment of the mask for the isolation is not required. Also, since the margin is not required, the isolation part 23 may be formed by using the plurality of p-type electrodes 140 formed without the margin as the mask to reduce the interval between the plurality of light emitting pixels 20 to approximately 5 μm to approximately 10 μm, thereby reducing the dark region between the plurality of light emitting pixels 20, which is generated by the isolation part 23.

Also, since the alignment of the mask is not required, a time taken to align the mask may not be required to reduce the process time and simplify the process. The pattern (for example, the photomask) of the mask for etching the portions of the p-type semiconductor layer 123 and the active layer 122 may be simplified. Also, the interval between the plurality of light emitting pixels 20 may be reduced so that the plurality of light emitting pixels 20 are gathered into a smaller area (i.e., a surface area of the micro-array is reduced). Thus, an overall moving distance of charges that move to the plurality of light emitting pixels 20 may be reduced in the n-type electrode 130. Thus, the n-type electrode 130 may be formed as the common electrode. Also, the n-type electrode 130 may be formed only outside (or the circumference of the micro-array) the active layer 122 and the p-type semiconductor layer 123, of which the edges are etched. Also, the pattern (i.e., the surface area of the emission area or the emission area of the light emitting pixel) of the plurality of light emitting pixels 20 may be adjusted only by adjusting the size (or the surface area), the shape (or the configuration), and the interval (or the pattern interval) of each of the plurality of p-type electrodes 140 or the reflection layer 150. Thus, the interval of the pattern of the plurality of p-type electrodes or the reflection layer 150 may be adjusted to reduce the interval between the plurality of light emitting pixels 20 and reduce the dark region between the plurality of light emitting pixels 20. Also, since the positions of the plurality of p-type electrodes 140 or the reflection layer 150 are aligned, the isolation part 23 may be very accurately formed, and thus, the semiconductor lamination structure 120 may be isolated into the plurality of light emitting pixels 20.

In the process (S300) of forming the isolation part 23, the plurality of p-type electrodes 140 may be used as the mask to form the isolation part 23. Thus, the semiconductor lamination structure 120 may be isolated into the plurality of light emitting pixels 20 in the self-aligning manner in which the plurality of p-type electrodes 140 are used as the mask. The plurality of p-type electrodes 140 may be formed of a metal and thus may not be affected by the etching that is performed to form the isolation part 23 and the increase of the electrical insulation and stably serve as the mask for the isolation. In addition, since the plurality of p-type electrode 140 is a hard mask, the damage of the edge, which occurs in the soft mask such as the photomask, may hardly occur. Thus, the isolation part 23 may be more accurately formed when compared to the photolithography process using the photomask, and the semiconductor lamination structure 120 may be isolated into the plurality of light emitting pixels 20.

When a shadow mask formed of a metal that is stable with respect to the etching that 1is performed to form the isolation part 23 and the increase of the electrical insulation, a gap may occur between the semiconductor lamination structure 120 and the shadow mask because the shadow mask is not closely attached to the semiconductor lamination structure 120 to prevent the semiconductor lamination structure 120 from being damaged. Also, an area on which the isolation part 23 is formed may be widened in accordance with characteristics of the shadow mask in which a treating width for the etching is widened in accordance with a distance from the metal mask, and thus, the interval between the plurality of light emitting pixels 20 may be widened. However, since the plurality of p-type electrodes 140 are closely attached to the semiconductor lamination structure 120, a gap between the plurality of p-type electrodes 140 and the semiconductor lamination structure 120 may not occur to further reduce the interval between the plurality of light emitting pixels 20 when compared to the metal mask and further reduce the dark region between the plurality of light emitting pixels 20 when compared to the metal mask.

Figure 2:
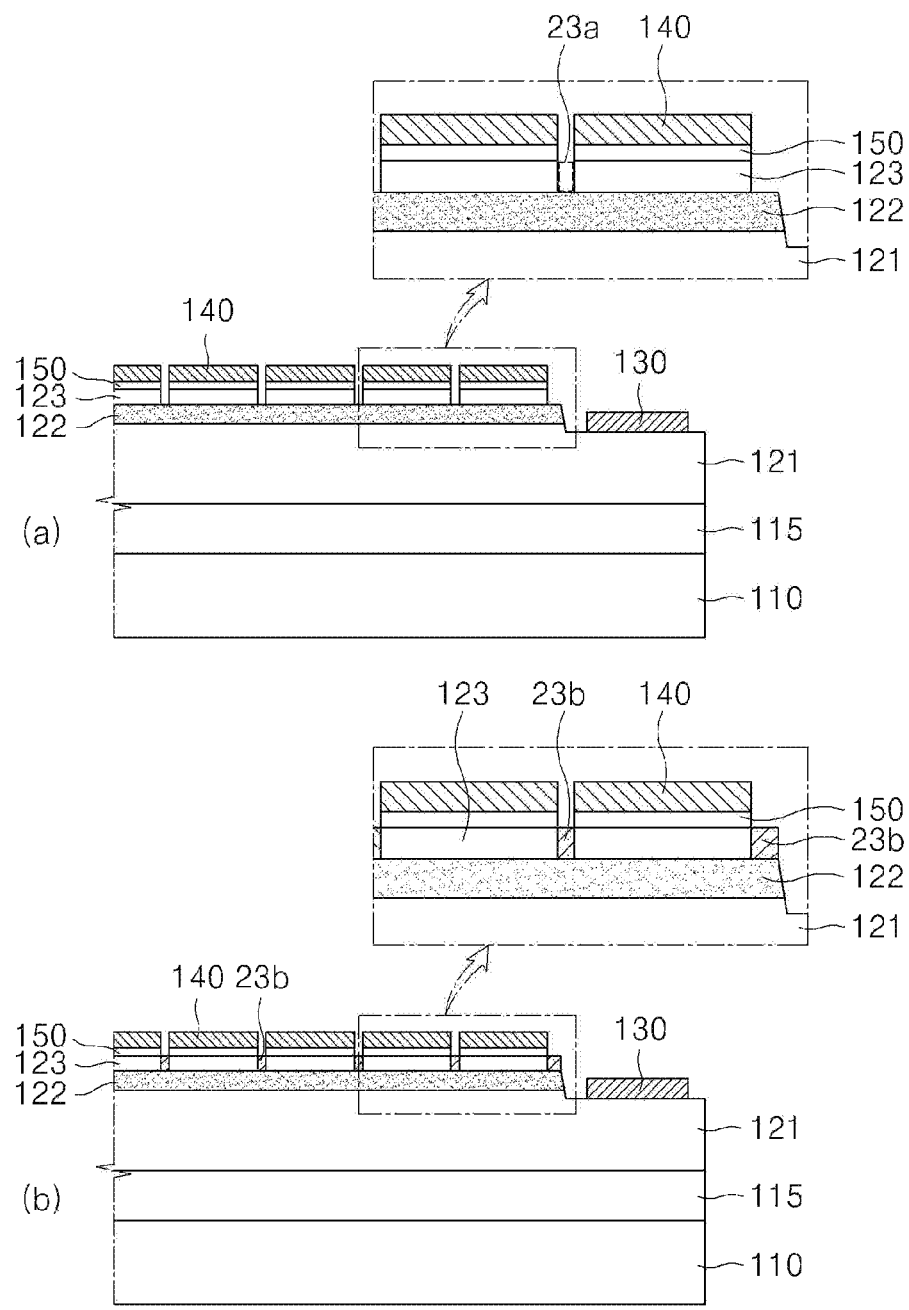
FIG. 2 is a cross-sectional view illustrating an isolation method of a light emitting pixel in accordance with an exemplary embodiment.

FIG. 2 is a cross-sectional view illustrating an isolation method of the light emitting pixel in accordance with an exemplary embodiment. (a) of FIG. 2 is a view illustrating an isolation method using etching, and (b) of FIG. 2 is a view illustrating an isolation method in which electric isolation increases.

Referring to FIG. 2, in the process (S300) of forming the isolation part 23, at least a portion of the exposed p-type semiconductor layer 123 may be etched or increase in electrical insulation. When the plurality of p-type electrodes 140 or the reflection layer 150 are formed along the pattern for the isolation, the p-type semiconductor layer 123 may be exposed between the plurality of p-type electrodes 140. Then, the exposed p-type semiconductor layers 123 may be insulation-treated to isolate the semiconductor lamination structure 120 into the plurality of light emitting pixels 20. Here, as illustrated in (a) of FIG. 2, at least a portion (or a portion of a thickness) of the p-type semiconductor layer 123 exposed between the plurality of p-type electrodes 140 may be etched. Alternatively, as illustrated in (b) of FIG. 2, at least a portion of the exposed p-type semiconductor layer 123 may increase in electrical insulation.

When at least a portion of the exposed p-type semiconductor layer 123 is etched, the exposed etched part 23a of the p-type semiconductor layer 123 may be etched by using the plurality of p-type electrodes 140 or the reflection layer 150 as the mask to isolate the semiconductor lamination structure 120 into the plurality of light emitting pixels 20. Here, the p-type electrode 140 may be formed of a material (for example, a metal) that is not etched during the etching process and has high resistance with respect to the etching.

When at least a portion of the exposed p-type semiconductor layer 123 increases in electrical insulation, at least one of ion implantation, plasma treatment, and E-beam treatment may be used to change at least a portion of the exposed p-type semiconductor layer 123 into the insulating part 23b. For example, ions may be implanted into at least a portion of the exposed p-type semiconductor layer 123 to increase in electrical insulation. That is, hydrogen (H), oxygen (O), nitrogen (N) ions may be implanted into at least a portion (for example, p-GaN) of the exposed p-type semiconductor layer 123 to increase in electrical insulation of at least a portion of the exposed p-type semiconductor layer 123. When the ions are implanted into the p-type semiconductor layer 123, the p-type semiconductor layer 123 may be damaged, or trap may be generated in the p-type semiconductor layer 123 to reduce carrier hopping, and thus, the current does not flow through the p-type semiconductor layer 123. Thus, the insulation part 23b may be formed between the plurality of light emitting pixels 20. Here, the p-type electrode 140 may be formed of a material that is not changed in electric characteristic when the ions are implanted. Here, general metals may not be significantly affected by the ion implantation.

Also, at least a portion of the exposed p-type semiconductor layer 123 may be plasma-treated to increase in electrical insulation. Here, at least the portion (for example p-GaN) of the exposed p-type semiconductor layer 123 may be plasma-treated by using hydrogen (H2), oxygen (O2), nitrogen (N2), carbon tetrafluoride (CF4), fluorine (CHF3), or fluorine-based gas or a combination thereof. When the p-type semiconductor layer 123 is plasma-treated, defects (e.g., bonding of ionic atoms and gallium atoms (Ga) or nitrogen atoms (N)) may occur in gallium nitride (GaN) due to the ionic atoms to cut off the current. Thus, the insulation part 23b may be formed between the plurality of light emitting pixels 20. The p-type electrode 140 may be formed of a material having no change in electrical characteristic during the plasma treatment, and the plasma may not have a large effect on the general metals.

Also, at least a portion of the exposed p-type semiconductor layer 123 may be subjected to an electron beam irradiation treatment to increase in electrical insulation. When an electron beam (E-beam) is irradiated to at least a portion (for example, p-GaN) of the exposed p-type semiconductor layer 123, electrons emitted upon irradiation of the electron beam may combined with holes serving as a carrier of the p-type semiconductor layer 123 to extremely reduce the electrical characteristics within the exposed area (or the area to which the E-beam is irradiated) of the p-type semiconductor layer 123, and thus, the current may not flow. Thus, the insulation part 23b may be formed between the plurality of light emitting pixels 20.

Here, to stabilize the electron beam atmosphere, an electron beam irradiation treatment may be performed in an inert gas plasma atmosphere such as argon (Ar). When the electron beam irradiation treatment is performed in the inert gas (for example, the argon gas) plasma atmosphere, the electron beam atmosphere may be stabilized, and the electron beam irradiation treatment may be effective. Also, the p-type electrode 140 may be formed of a material having no change in electrical characteristic during the electron beam irradiation treatment, and the plasma may not have a large effect on the general metals. Although strong light may be emitted from the exposed p-type semiconductor layer 123 before the electron beam irradiation treatment, the exposed p-type semiconductor layer 123 may be exposed to the electron beam to decrease in electrical characteristics, and the current may not flow after the electron beam irradiation treatment. Thus, the light may not be emitted.

In an exemplary embodiment, the isolation part 23 may be formed only on a portion of the thickness (approximately 30 nm or less) of the p-type semiconductor layer 123. Since the p-type semiconductor layer 123 has low electrical conductivity due to its high electrical resistance, the charges may be prevented from being transferred between the plurality of light emitting pixels 20 even if the isolation part 23 is formed only on the portion of the thickness, and the semiconductor lamination structure 120 may be isolated into the plurality of light emitting pixels 20.

After the process (S300) of forming the isolation part 23, the active layer 122 and the n-type semiconductor layer 121 may be the same as before the process (S300) of forming the isolation part 23. That is to say, when at least a portion of the exposed p-type semiconductor layer 123 is etched, a volume of each of the active layer 122 and the n-type semiconductor layer 121 may be the same as before the process (S300) of forming the isolation part 23. When the electrical insulation of at least a portion of the exposed p-type semiconductor layer 123 increases, the active layer 122 and the n-type semiconductor layer 121 disposed under the exposed p-type semiconductor layer 123 may have the same electrical conductivity as before the process (S300) of forming the isolation part 23. That is, the isolation part 23 may be formed only on the p-type semiconductor layer 123, and the active layer 122 and the n-type semiconductor layer 121 may not be affected in the process (S300) of forming the isolation part 23.

When at least a portion of the exposed p-type semiconductor layer 123 is etched, at least the portion of the exposed p-type semiconductor layer 123 may etched so that the volume (or the entire volume) of each of the active layer 122 and the n-type semiconductor layer 121 is the same as before being isolated into the plurality of light emitting pixels 20. That is, the active layer 122 and the n-type semiconductor layer 121 may not be etched, but only the exposed p-type semiconductor layer 123 may be etched, the entire exposed p-type semiconductor layer 123 may be etched, or a portion of the exposed p-type semiconductor layer 123 may be etched. In this case, only the p-type semiconductor layer 123 having the thin thickness of approximately 30 nm may be etched to reduce a difference in distance from the p-type electrode 140 or the reflection layer 150, which is used as the mask, thereby reducing an etching width. Thus, the interval between the plurality of light emitting pixels 20 may be more reduced, and the dark region between the plurality of light emitting pixels may be more reduced.

Furthermore, the isolation part 23 may be formed only on a portion of the thickness of the p-type semiconductor layer 123. Since the p-type semiconductor layer 123 has low electrical conductivity due to its high electrical resistance, the charges may be prevented from being transferred between the plurality of light emitting pixels 20 even if the isolation part 23 is formed only on the portion of the thickness, and the semiconductor lamination structure 120 may be isolated into the plurality of light emitting pixels 20. Thus, since the isolation part 23 is formed only on a portion of the thickness of the p-type semiconductor layer 123 having the thin thickness (that is, within a minimum thickness or approximately 30 nm or less), the width (for example, etching width) of the isolation part 23 may be more reduced, and thus, the interval between the plurality of light emitting pixels 20 may be minimized to approximately 5 μm or less, and the dark region between the plurality of light emitting pixels 20 may be minimized Also, when the process (S300) of forming the isolation part 23 is performed for a long time, the etching, the insulation increase, and the like may have an influence on the emission area. For example, the light emitting pixels 20 such as the p-type electrodes 140 may be damaged, and the characteristics of the p-type electrodes 140 may be changed due to the damage so that light absorption occurs. Thus, the light emission characteristic of the light emitting pixel 20 such as the luminous intensity may be degraded. The active layer 122 or the n-type semiconductor layer 121 under the isolation part 23 may be affected. However, since the time taken to perform the process (S300) of forming the isolation part 23 is reduced by forming the isolation part 23 only on a portion of the thickness of the p-type semiconductor layer 123, the influence on the emission area due to the formation of the isolation part 23 such as the deterioration in light emitting characteristics of the light emitting pixel 20 may be suppressed or prevented.

Also, since the active layer 122 is not etched so that the active layer 122 also exists on an area between the plurality of p-type electrodes 140, the emission surface area of the plurality of light emitting pixels 20 may be widened, and it may be advantageous to minimize the dark region between the plurality of light emitting pixels 20. Also, the n-type semiconductor layer 121 may not be etched so as not to reduce the resistance of the n-type semiconductor layer 121, and the surface area (or total surface area) of the n-type electrode 130 may be reduced.

When the electrical insulation of at least a portion of the exposed p-type semiconductor layer 123 increases, the electrical insulation of at least the portion of the exposed p-type semiconductor layer 123 may increase so that the active layer 122 and the n-type semiconductor layer 121, which are disposed below (or a lower side) the exposed p-type semiconductor layer 123 have the same electrical conductivity as before the isolation. That, the active layer 122 and the n-type semiconductor layer 121 may increase only in electrical insulation of the exposed p-type semiconductor layer 123 without increasing in electrical insulation, the overall electrical insulation of the exposed p-type semiconductor layer 123 may increase, or a portion of the exposed p-type semiconductor layer 123 may increase in electrical insulation. In this case, the active layer 122 exists on the entire emission area and also an area between the plurality of p-type electrodes 140. Thus, the emission surface area of the plurality of light emitting pixels 20 may be widened, and it may be advantageous to minimize the dark region between the plurality of light emitting pixels 20. Furthermore, in the case of forming the isolation part 23 only on a portion of the thickness of the p-type semiconductor layer 123, the width of the isolation part 23 may be further reduced to minimize the interval between the plurality of light emitting pixels 20 and minimize the dark region between the plurality of light emitting pixels 20. Also, the portion of the n-type semiconductor layer 121 at which the insulation increases may not occur, and thus, the resistance of the n-type semiconductor layer 121 may not be reduced, and the surface area of the n-type electrode 130 may be reduced.

Figure 3:
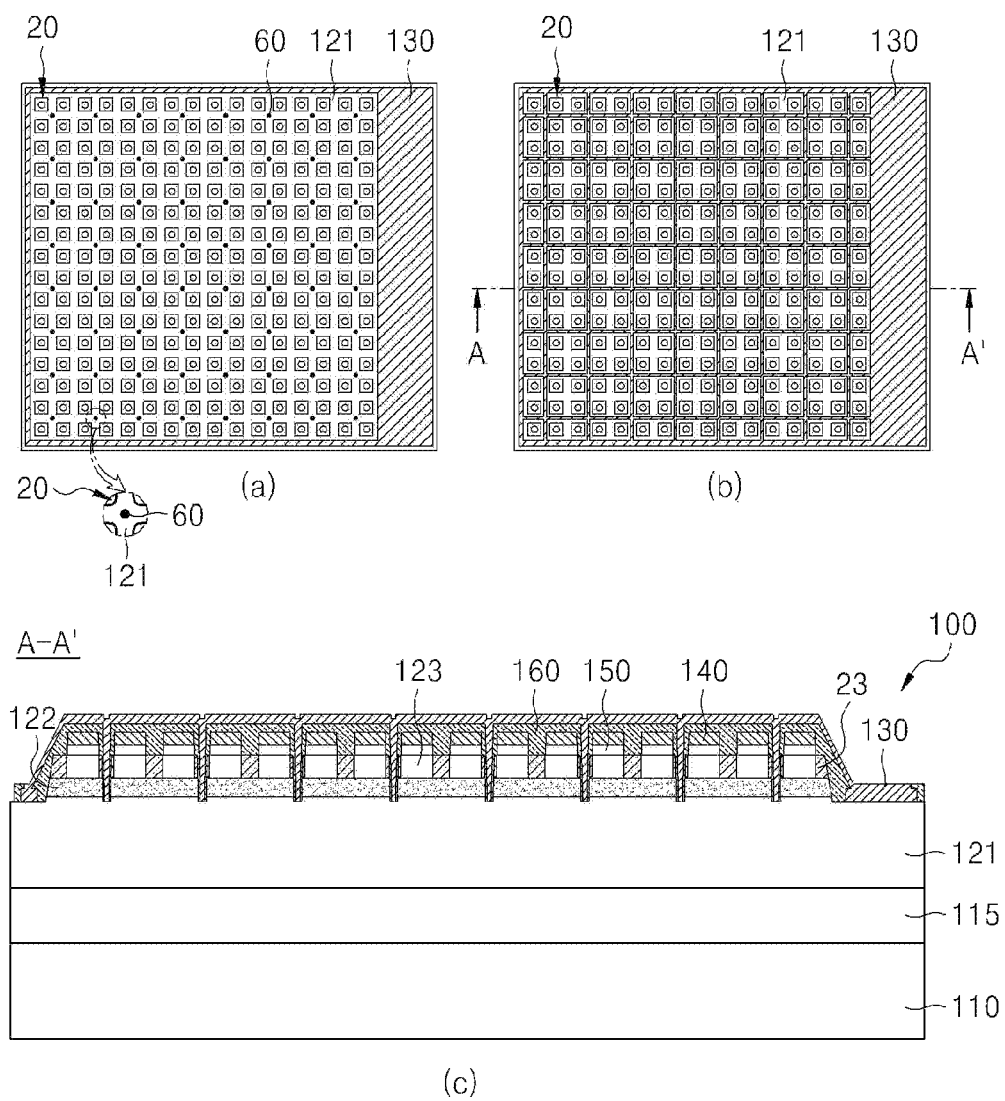
FIG. 3 is a view for explaining conducting wire connection of an n-type electrode in accordance with an exemplary embodiment.

FIG. 3 is a view for explaining conducting wire connection of the n-type electrode in accordance with an exemplary embodiment. (a) of FIG. 3 is a plan view illustrating a state in which a via hole is formed to pass through an interlayer dielectric formed on the plurality of p-type electrodes, (b) of FIG. 3 is a plane view illustrating state in which a conductive material is filled into the via hole so as to be connected to the n-type electrode, and (c) of FIG. 3 is a cross-sectional view illustrating connection between the interlayer dielectric formed on the plurality of p-type electrode and the n-type electrode.

Referring to FIG. 3, the method for manufacturing the micro-array light emitting diode in accordance with an exemplary embodiment may further include a process (S410) of forming an interlayer dielectric 160 on the plurality of p-type electrodes 140, a process (S420) of forming a via hole that passes through the interlayer dielectric 160 between the plurality of p-type electrodes 140 to expose the n-type semiconductor layer 121, and a process (S430) of filling a conductive material into the via hole 60.

The interlayer dielectric 160 may be formed on the plurality of p-type electrodes 140 (S410). The interlayer dielectric 160 may be formed on the plurality of p-type electrodes 140 and be formed on an entire top surface of the substrate 110 to cover the exposed portions of the plurality of p-type electrodes 140, the n-type electrode 130, and the n-type semiconductor 121. Also, the interlayer dielectric 160 may be an inter metal dielectric (IMD) or an interlayer dielectric (ILD). The interlayer dielectric 160 may be formed of oxide or nitride having excellent electrical insulation such as photosensitive polyimide (PSPI), silicon dioxide (SiO2), silicon dioxide (Si2N4), alumina (Al2O3), silicon nitride (SiN), or the like and being capable of preventing humidity from being changed. The interlayer dielectric 160 may be formed of an inorganic or organic material having the insulation and may be provided as a single layer or a plurality of layers. The interlayer dielectric 160 may be formed by using a spin coating process, a printing process, a sputtering process, a chemical vapor deposition (CVD) process, an atomic layer deposition (ALD) process, a plasma enhanced chemical vapor deposition (PECVD) process, a high-density plasma-chemical vapor deposition (HDP-CVD) process, a vacuum deposition process, or the like.

For example, the interlayer dielectric 160 may be formed on the plurality of p-type electrodes 140 by using a photosensitive polyimide (PSPI) material having excellent insulation. Here, to ensure sufficient insulation, the interlayer dielectric 160 may have a thickness of approximately 0.5 µm or more. Here, the photosensitive polyimide (PSPI) may be a photosensitive polymer and have properties such as positive photoresist (positive PR) and may form a pattern through the photolithography process. When curing after forming the pattern, the photosensitive polyimide (PSPI) may perform functions of insulation and passivation as a polymer. An edge of the photosensitive polyimide (PSPI) may have an inclined angle of approximately 60° after the curing. Also, the photosensitive polyimide (PSPI) may have a coating thickness of approximately 4 µm to approximately 5 µm, and the thickness may be adjusted in accordance with a rotation rate (or rpm) of the spin coating.

Also, the interlayer dielectric 160 may be formed to insulate the plurality of p-type electrodes 140 from each other, insulate the p-type electrode 140 from the n-type electrode 130, insulate the p-type electrode 140 from the n-type electrode 130, and insulate semiconductors having different characteristics (for example, between the p-type electrode and the n-type semiconductor layer, between the n-type electrode and the p-type semiconductor, and the like) from each other. Here, the interlayer dielectric 160 may be provided as a plurality of layers in accordance with the conducting wire connection of the p-type electrode 140 and the n-type electrode 130.

Also, the interlayer dielectric 160 may protect the plurality of light emitting pixels 20 from external environments such as heat, moisture, and the like and be formed of a material, which is capable of preventing a temperature or humidity from being changed, to protect the plurality of light emitting pixels 20 from heat. When the micro-array light emitting diode 100 is used for a headlamp for a vehicle, the plurality of light emitting pixels 20 may be prevented or suppressed from being damaged by a high engine room temperature (approximately 150° C.) to improve reliability of the micro-array light emitting diode 100.

Then, a via hole 60 may be formed to pass through the interlayer dielectric 160 between the plurality of p-type electrodes 140 and thereby to expose the n-type semiconductor layer 121 (S420). The via hole 60 may be formed so as not to interfere with the plurality of light emitting pixels 20. The via hole 60 may be formed to pass through the interlayer dielectric 160 between the plurality of p-type electrodes 140 and thereby to expose the n-type semiconductor layer 121. When the p-type semiconductor layer 123, the insulating part 23b, or the active layer 122 is disposed between the interlayer dielectric 160 and the n-type semiconductor layer 121, the via hole 60 may pass through the p-type semiconductor layer 123, the insulating part 23b, or the active layer 122, which is disposed between the interlayer dielectric 160 and the n-type semiconductor layer 121. Here, a portion of the via hole 60, which passes through the p-type semiconductor layer 123 and the active layer 122 may be formed in the process (S150) of etching portions of the p-type semiconductor layer 123 and the active layer 122 to form the n-type electrode 130. Here, a portion formed to pass through the p-type semiconductor layer 123 and the active layer 122 in the process (S150) of etching the portions of the p-type semiconductor layer 123 and the active layer 122 may be a sub via hole. The process (S300) of forming the isolation part 23 may be performed after filling the metal material (or the conductive material) such as a n-type metal into the via sub hole so that the isolation part is not formed on the n-type semiconductor layer 121. In this case, the sub via hole may pass through only the interlayer dielectric 160 to expose the n-type semiconductor layer 121, and thus, the via hole 60 may be formed easily.

For example, the interlayer dielectric 160 may be formed of a photosensitive polyimide (PSPI) material, and a portion thereof to be etched for forming the via hole 60 may be exposed and developed through the photolithography process to pattern the interlayer dielectric 160. As a result, the interlayer dielectric 160 may be penetrated. Here, the plurality of p-type electrodes 140 and n-type electrodes 130 electrically connected to a circuit board 210 may be exposed through the patterning of the interlayer dielectric 160. In the process (S150) of etching the portions of the p-type semiconductor layer 123 and the active layer 122, when the sub via hole is formed, the n-type semiconductor layer 121 may be exposed only by patterning the interlayer dielectric 160 using the photosensitive polyimide (PSPI), and the via hole 60 may be formed without an additional etching process.

The via hole 60 may be formed in a portion at which a horizontal isolation line for isolating the semiconductor lamination structure 120 to horizontally arrange the plurality of light emitting pixels 20 and a vertical isolation line for isolating the semiconductor lamination structure 120 to horizontally arrange the plurality of light emitting pixels 20 cross each other. That is, the light emitting pixels 20 may be disposed only in a diagonal direction of the via hole 60, and the via hole 60 may be formed in position at which the light emitting pixels 20 are not disposed in all of the horizontal and vertical directions of the via hole 60 (for example, a space between the four light emitting pixels). In this case, the length of the via hole 60 in the horizontal and vertical directions may increase within a range in which the width of the via hole 60 in the diagonal direction does not exceed a predetermined length (or a predetermined width), and an interval between two light emitting pixels disposed in the diagonal direction may be greater than that between the light emitting pixels adjacent to each other in the horizontal and vertical directions. Thus, the shortest width of the via hole (for example, a diameter of the via hole when the via hole has a circular shape) may be maximized Thus, a size (or surface area) of the via hole 60 may increase, and thus, formation of the via hole 60 may be facilitated. Also, in the case of forming a conductive plug which is connected to an n-type electrode line formed on the interlayer dielectric 160 by extending from the n-type electrode 130 by filling the via hole 60 with a conductive material, a contact area of the conductive plug contacting the n-type semiconductor layer 121 may increase, and the current may be stably supplied to the n-type semiconductor layer 121 of the plurality of light emitting pixels 20.

Also, the shape of the via hole 60 may be circular, elliptical, '+', or the like, but is not particularly limited thereto. For example, the via hole 60 may have a shape that is effectively formed in consideration of the supply of the current to the n-type semiconductor layer 121 through the conductive material (or the conductive plug).

Also, the conductive material may be filled into the via hole 60 (S430). The via hole 60 may be filled with the conductive material, and the conductive material may form the conductive plug connecting the n-type semiconductor layer 121 to the n-type electrode line. The conductive plug may be configured to electrically connect the n-type semiconductor layer 121 to the n-type electrode line by filling the conductive material (for example, the metal material) having excellent electrical conductivity and thermal conductivity inside the via hole 60 and may be formed of a material having the excellent electrical conductivity and the thermal conductivity such as copper (Cu), copper tungsten (CuW), aluminum (Al), gold (Au), silver (Ag), or the like.

Here, the positions and the number of the conductive plugs may vary depending on the resistance of the n-type semiconductor layer 121 in accordance with the surface area and the characteristics thereof or the difference in resistance between the emission areas (or micro-arrays). If the plurality of light emitting pixels 20 are grouped by four as shown in FIGS. 3A and 3B to form the conductive plugs for each space between the four light emitting pixels 20, the current may be stably (or uniformly) supplied to all the plurality of light emitting pixels 20. That is, the current may be supplied to the n-type semiconductor layer 121 for each group through the plurality of conductive plugs, and since the four light emitting pixels 20 are disposed at the same distance from the conductive plug, the current may be uniformly supplied from the conductive plug to the four light emitting pixels 20.

Also, the conductive material filled in the via hole 60 may also have thermal conductivity to release heat generated in the light emitting pixel 20. The heat transferred by the conductive material may be directly released from the conductive plug or may be transferred to the n-type electrode line or the like so as to be released.

The p-type electrode 140 may have a shape that has a surface area less than that of a general square to increase in size of the via hole 60 (for example, a shape in which a corner of the square is rounded, a shape that is be inscribed with the square or disposed inside the square, and the like). Here, as illustrated in the enlarged view of (a) of FIG. 3, a shape in which at least one corner (or vertex) of the square is rounded may be preferable to secure a sufficient space for forming the via hole 60 (or a sufficient space between the diagonal directions of the light emitting pixels) and to secure the emission surface area of each light emitting pixel 20. In this case, the formation of the via hole 60 may be facilitated, the contact area of the conductive plug contacting the n-type semiconductor layer 121 may increase, and the surface areas of the light emitting pixel 20 and the isolation portion 23 may be secured so as not to be influenced by the driving of the plurality of light emitting pixels 20 and the performance of the micro-array light emitting diode 100. Also, the n-type electrode 130, the n-type electrode line, and the conductive plug may be formed of the same material. Also, some of the via holes 60 may be filled with an insulating material having thermal conductivity or may perform heat dissipation through the insulating material.

The micro-array light emitting diode 100 in accordance with an exemplary embodiment may relatively reduce the size of the micro-array by minimizing the interval between the plurality of light emitting pixels 20. Thus, it may be easy to secure a space in which the n-type electrode 130 is formed outside the micro-array (or the emission region) when compared to the related art, and the entire size of the micro-array light emitting diode 100 may be reduced.

As described above, in the method of manufacturing a micro-array light emitting diode in accordance with an exemplary embodiment, since the isolation part 23 is formed only on a portion of the thickness of the p-type semiconductor layer 123 having the high electrical resistance and the low electrical conductivity, the width (for example, the etching width) of the isolation part 23 may be reduced. Thus, the p-type semiconductor layer 123 may reduce the interval between the plurality of light emitting pixels 20 (i.e., the dark region). Also, an additional mask for the mesa etching may not be required because the isolation part 23 is formed only on the portion of the thickness of the p-type semiconductor layer 123, the isolation part 23 may be formed in the self-aligning manner that does not require the alignment of the additional mask for the isolation. Also, since the margin is not required, the isolation part 23 may be formed by using the plurality of p-type electrodes 140 as the mask without the margin to reduce the internal between the plurality of light emitting pixels 20 when compared to the related art and also minimize the dark region between the plurality of light emitting pixels 20, which is generated by the isolation part 23.

Figure 4:
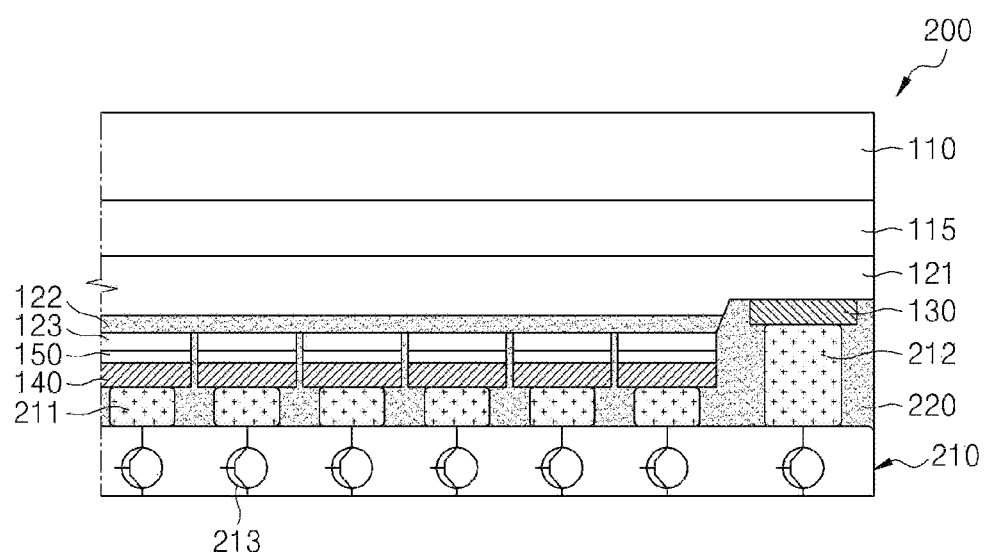
FIG. 4 is a schematic cross-sectional view of a lighting device in accordance with another exemplary embodiment.

FIG. 4 is a schematic cross-sectional view of a lighting device in accordance with another exemplary embodiment.

A lighting device in accordance with another exemplary embodiment will be described with reference to FIG. 4. In the description of the lighting device in accordance with another exemplary embodiment, which are duplicated with respect to the method for manufacturing the micro-array light emitting diode in accordance with the foregoing embodiment will be omitted.

A lighting device 200 in accordance with another exemplary embodiment may include a micro-array light emitting diode 100 that is manufactured through the method for manufacturing the micro-array light emitting diode in accordance with the foregoing embodiment and a circuit board 210 which includes a plurality of first contact pads 211 electrically connected to a plurality of p-type electrodes 140 and a second contact pad 212 electrically connected to an n-type electrode of the micro-array light emitting diode 100 and on which the micro-array light emitting diode 100 is mounted.

The micro-array light-emitting diode 100 may be manufactured through the method of manufacturing the micro-array light-emitting diode according to the foregoing embodiment and may include a plurality of light-emitting pixels 20 arranged two-dimensionally. Here, the plurality of light emitting pixels 20 may be a light source of the lighting device 200 in accordance with another exemplary embodiment may emit light forward. The plurality of light emitting pixels 20 may form a plurality of light emitting patterns through the constitution and electrical control of the pixels. The plurality of light emitting pixels 20 may individually emit light to each of the divided light irradiation areas. That is, the micro-array light-emitting diode 100 may realize the plurality of light emitting patterns through the individual turn on/off of the plurality of light-emitting pixels 20. When the micro-array light-emitting diode 100 is used for a head lamp of a vehicle, the same effect as a cut-off line by a shield used in the head lamp for the vehicle in accordance with the related art may be obtained to prevent glare of an opposed vehicle driver from occurring.

The plurality of light emitting pixels 20 may be grouped into a plurality of unit blocks (for example, by each line). The plurality of unit blocks may form the light emitting patterns for each block, and the light emitting pattern of one unit block may be controlled by a transistor unit 213 of the circuit board 210 in accordance with the situation. That is, one unit block in which the light emitting pattern is implemented may be provided in plurality to implement one micro-array light emitting diode 100. Thus, the plurality of unit blocks may be controlled by the transistor unit 213 so that the plurality of unit blocks emit light corresponding to a desired light emitting pattern for each block.

The circuit board 210 may include a plurality of first contact pads 211 electrically connected to the plurality of p-type electrodes 140 and a second contact pad 212 electrically connected to the n-type electrodes 130. The micro-array light emitting diode 100 may be mounted on the circuit board 210. In the circuit board 210, the plurality of p-type electrodes 140 may be bonded to the plurality of first contact pads 211, and the n-type electrode 130 may be bonded to the second contact pads 212, and thus, the light emitting diode 100 may be mounted on the circuit board 210. Here, the plurality of p-type electrodes 140, the plurality of first contact pads 211, the n-type electrode 130, and the second contact pads 212 may be bonded to each other by using an adhesive. The adhesive may include a solder ball having conductivity so that the plurality of p-type electrodes 140 and the plurality of first contact pads 211 and the n-type electrode 130 and the second contact pad 212 are electrically connected to each other to transmit an electrical signal received from an external circuit.

The substrate 110 may be a light-transmitting substrate, and the circuit board 210 may be a thermally conductive substrate. The micro-array light emitting diode 100 may be a flip-chip type light emitting diode. In the flip-chip type light emitting diode, the substrate 110 may be a light-transmitting substrate and may include a sapphire substrate. When the substrate 110 is the light-transmitting substrate such as the sapphire substrate, the other surface of the substrate 110 (that is, a surface on which the semiconductor lamination structure is not formed) may be used as an emission surface in a direction of the substrate 100 in which light is emitted. Also, the circuit board 210 may be a thermally conductive substrate and may include a heat-dissipation metal substrate (metal PCB). The circuit board 210 may be formed of an insulation material having excellent thermal conductivity and may be formed of a material selected from boron nitride (BN), alumina (Al2O3), aluminum nitride (AlN), beryllium oxide (BeO), and glass ceramic. However, the material of the circuit board 210 is not limited thereto. For example, various materials having the excellent thermal conductivity may be used for activating the heat dissipation of the micro-array light emitting diode 100 or the lighting device 200. Since the thermally conductive substrate is used as the circuit substrate 210, heat generated in the plurality of light emitting pixels 20 or the micro-array light emitting diode 100 may be efficiently released to the outside to improve performance and reliability of the micro-array light emitting diode 100 and the lighting device 200 and prolong lifespans of the micro-array light emitting diode 100 and the lighting device 200.

The lighting device 200 in accordance with another exemplary embodiment may further include an underfill layer 220 that is thermally conductive and filled between the substrate 110 and the circuit board 210. The underfill layer 220 may be thermally conductive and may be filled between the substrate 110 and the circuit board 210 to effectively dissipate the heat generated in the plurality of light emitting pixels 20. Here, the underfill layer 220 may be formed between the light emitting pixel 20 and the circuit board 210 by filling an underfill material having excellent thermal conductivity such as a metal into a space between the substrate 110 on which the plurality of light emitting pixels 20 are formed and the circuit board 210 and curing the underfill material by using an underfill technique. Here, the underfill technology may be a technique of filling a portion under (or below) a light emitting diode package such as a chip scale package (CSP), a ball grid array (BGA), a flip chip, and a micro-array light emitting diode 100 with thermally conductive material having excellent thermal conductivity or an insulation resin. The underfill techniques may be used in devices that are subject to physical shock or thermal shock.

Also, the underfill material may have properties such as thermal expansion coefficient, resistance, thermal conductivity, waterproof properties, and viscosity, which vary depending on types and contents of epoxy resin, curing agent, filler, and additive. For example, the underfill layer 220 may be formed by using at least one of thermal conductive materials having excellent thermal conductivity such as an epoxy resin such as 3,4-epoxy cyclohexylmethyl-3,4-epoxy cyclohexane carboxylate, a curing agent such as hexahydro-4-methylphthalic anhydride, an additive such as cobalt (II) acetylacetonate, a silica material, alumina (Al2O3), boron nitride), aluminum nitride (AlN), and the like.

If the underfill layer 220 is filled between the substrate 110 and the circuit board 210, the plurality of light emitting pixels 20 formed on the substrate 110 may be protected through the underfill layer 220 from the outside, and also, the thermal conductivity from the micro-array light emitting diode 100 to the circuit board 210 may be substantially improved through the thermally conductive material to reduce the thermal expansion deformation of the substrate 110 and the circuit board 210 due to the temperature change caused by the heat generated in the micro-array light emitting diode 100. Also, since a sufficiently low temperature is maintained at at least one of the substrate 110 and the circuit board 210, the micro-array light emitting diode 100 or the lighting device 200 may be improved in performance and reliability and prolonged in lifespan.

The n-type electrode line and the conductive plug may contact the circuit board 210 to dissipate heat or may contact the underfill layer 220 to transfer heat to the circuit board 210 through the underfill layer 220.

The circuit board 210 may include a transistor unit 213 connected to the p-type electrode 140 to switch current supplied to the p-type electrode 140. The transistor unit 213 may be connected to the p-type electrode 140 to switch the current supplied to the p-type electrode 140 and switch the turn on/off of the light emitting pixel 20. Here, when the current is supplied from the external circuit to the circuit board 210, the current may be individually supplied to the plurality of light emitting pixels 20 by the switching operation of the transistor unit 213 to emit light. Here, each of the plurality of light emitting pixels 20 may be turned on or off in accordance with a desired light emitting pattern when the control signal and the current of the transistor unit 213 are received.

The lighting device 200 in accordance with another exemplary embodiment may control the light emitting pattern in accordance with various surrounding environments or situations. The user may select the desired light emitting pattern from a plurality of light emitting patterns by a simple operation. The light may be emitted with the desired light emitting pattern by the transistor unit 213 and a driver module (not shown) that drives the transistor unit 213 in accordance with the light emitting pattern selected by the user.

The lighting device 200 in accordance with the exemplary embodiment may be the head lamp for transport means, for example, the head lamp for the vehicle. Although the lighting device 200 in accordance with the exemplary embodiment has been described as an example of the vehicle, the lighting device 200 may be merely an illustrative example. If the lighting device 200 is a product intended for the transport means other than the vehicle such as an airplane, a ship, and the like, the lighting device 200 in accordance with the exemplary embodiment may be equally used.

As described above, the isolation part may be formed on the p-type semiconductor layer exposed between the plurality of p-type electrodes in the self-aligning manner (or by using the plurality of p-type electrodes as the mask) to reduce the interval between the plurality of light emitting pixels. Thus, the dark region between the plurality of light emitting pixels may be reduced to improve the intensity of light of the micro-array light emitting diode and also improve the visibility of the lighting device. Also, the emission surface area of each light emitting pixel may increase as the dark region is reduced, or the plurality of light emitting pixels may be gathered in a smaller region. Also, the n-type electrode may be used as the common electrode of the n-type semiconductor layer to form the n-type electrode on the non-emission area outside the emission area. Thus, the interval between the plurality of light emitting pixels may be more reduced, and the dark region between the plurality of light emitting pixels may be more reduced. Also, when the semiconductor lamination structure is isolated into the plurality of light emitting pixels, only the p-type semiconductor layer may be etched, or the electrical insulation may be improved to minimize the interval between the plurality of light emitting pixels, thereby minimizing the dark region between the plurality of light emitting pixels. Also, the active layer may be provided on the area between the p-type electrodes to widen the emission area of each of the light emitting pixels and minimize the dark region between the plurality of light emitting pixels. The interval between the plurality of light emitting pixels may be minimized to improve the integration of the plurality of light emitting pixels. Thus, the n-type electrode may be easily used as the common electrode of the plurality of light emitting pixels. Also, the moving distance of the charges through the n-type semiconductor layer may be reduced. Therefore, even though the n-type electrode is formed only outside the emission area in which the space for forming the n-type electrode is easily secured, the current may be stably supplied the plurality of light emitting pixels, and the whole size of the micro-array light emitting diode may be reduced.

The term "~on" used in the above description includes a case in which it is located directly opposite to the upper (upper) or lower (lower) position in direct contact with the surface, regardless of its position. It is also possible to locate not only the entire upper surface or the entire lower surface but also the partial upper surface or the lower surface, and it is used in the mean that it is opposed in position or contact directly to upper or lower surface, regardless of its surface area. For example, the "on substrate" may be the surface (upper surface or lower surface) of the substrate, or it may be the surface of the film deposited on the surface of the substrate. Also, the term "~upper (or lower)" includes the case where it is not in direct contact with the direct contact but is located at the upper (or lower), and it is sufficient to place it at a higher (or lower) height, and to use it to mean that it is in the upper (or lower) position or in direct contact with the upper (or lower) surface, regardless of its surface area.

Although embodiments have been described with reference to a number of illustrative embodiments thereof, the embodiments are not limited to the foregoing embodiments, and thus, it should be understood that numerous other modifications and embodiments can be devised by those skilled in the art that will fall within the spirit and scope of the principles of this disclosure. Hence, the real protective scope of the present invention shall be determined by the technical scope of the accompanying claims.

The invention claimed is:

1. A method for manufacturing a micro-array light emitting diode, the method comprising:
    laminating an n-type semiconductor layer, an active layer, and a p-type semiconductor layer on a substrate to form a semiconductor lamination structure;
    forming a plurality of p-type electrodes to be spaced apart from each other on the p-type semiconductor layer and arranged two-dimensionally;
    forming an isolation part on the p-type semiconductor layer exposed between the plurality of p-type electrodes in a self-aligning manner; and
    forming a reflection layer having the same pattern as arrangement of the plurality of p-type electrodes on the p-type semiconductor layer,
    wherein the forming of the plurality of p-type electrodes and the forming of the reflection layer are performed by using a single mask.

2. The method of claim 1, wherein, in the formation of the isolation part, the isolation part is formed by using the plurality of p-type electrodes as a mask.

3. The method of claim 1, wherein, in the formation of the isolation part, at least a portion of the exposed p-type semiconductor layer is etched, or at least a portion of the exposed p-type semiconductor layer increases in electrical insulation.

4. The method of claim 3, wherein, when at least the portion of the exposed p-type semiconductor layer increases in electrical insulation, at least one of ion implantation, plasma treatment, or E-beam irradiation is performed.

5. The method of claim 3, wherein, after the forming of the isolation part, the active layer and the n-type semiconductor layer are the same as before the formation of the isolation part.

6. The method of claim 1, further comprising:
    etching portions of the p-type semiconductor layer and the active layer to expose a portion of the n-type semiconductor layer; and
    forming an n-type electrode on the exposed n-type semiconductor layer as a common electrode of the n-type semiconductor layer.

7. The method of claim 6, wherein, in the etching of the portions of the p-type semiconductor layer and the active layer, edges of the p-type semiconductor layer and the active layer are etched, and
    in the forming of the n-type electrode, the n-type electrode is formed outside the active layer and the p-type semiconductor layer, of which the edges are etched.

8. The method of claim 1, further comprising:
    forming an interlayer dielectric on the plurality of p-type electrodes;
    forming a via hole passing through the interlayer dielectric between the plurality of p-type electrodes to expose the n-type semiconductor layer; and
    filling a conductive material into the via hole.

9. A lighting device comprising:
    the micro-array light emitting diode manufactured through the method of claim 1; and
    a circuit board which comprises a plurality of first contact pads electrically connected to the plurality of p-type electrodes and a second contact pad electrically connected to the n-type electrode of the micro-array light emitting diode, and on which the micro-array light emitting diode is mounted.

10. The lighting device of claim 9, wherein the substrate is a light-transmitting substrate, and the circuit board is a thermal conductive substrate.

11. The lighting device of claim 9, further comprising an underfill layer having thermal conductivity and filled between the substrate and the circuit board.

12. The lighting device of claim 9, wherein the circuit board comprises a transistor unit connected to the p-type electrode to switch current supplied to the p-type electrode.

* * * * *